US012787386B2

(12) United States Patent
Cheng

(10) Patent No.: US 12,787,386 B2
(45) Date of Patent: Nov. 3, 2026

(54) METHOD OF MANUFACTURING SEMICONDUCTOR STRUCTURE AND SEMICONDUCTOR STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 365 days.

(21) Appl. No.: 18/596,380

(22) Filed: Mar. 5, 2024

(65) Prior Publication Data

US 2024/0313053 A1 Sep. 19, 2024

(30) Foreign Application Priority Data

Mar. 15, 2023 (CN) ......................... 202310251606.1

(51) Int. Cl.
*H10D 62/10* (2025.01)
*H10D 12/01* (2025.01)
(Continued)

(52) U.S. Cl.
CPC ......... *H10D 62/124* (2025.01); *H10D 12/031* (2025.01); *H10D 62/8325* (2025.01);
(Continued)

(58) Field of Classification Search
CPC .... H10D 30/051; H10D 30/83; H10D 62/328; H10D 62/124; H10D 12/031;
(Continued)

(56) References Cited

U.S. PATENT DOCUMENTS

2011/0133212 A1* 6/2011 Sheridan .............. H10D 12/031 257/E29.313
2014/0191242 A1* 7/2014 Nie ...................... H10D 30/015 438/191

* cited by examiner

*Primary Examiner* — Wasiul Haider
(74) *Attorney, Agent, or Firm* — Carroll, Hoette & Butscher, LLC; Christopher R. Carroll

(57) ABSTRACT

This disclosure provides a method for manufacturing a semiconductor structure, which includes: providing a substrate, forming a mask layer on the substrate, where the mask layer is provided with an opening exposing the substrate; by using the mask layer as a mask, selectively growing a first semiconductor epitaxial layer at the opening, where the first semiconductor epitaxial layer does not cover a surface of the mask layer away from the substrate; removing mask layer, and forming a second semiconductor epitaxial layer on the substrate and the first semiconductor epitaxial layer by performing secondary epitaxy; where the second semiconductor epitaxial layer covers a surface of the first semiconductor epitaxial layer away from the substrate, and a conductivity type of the second semiconductor epitaxial layer is opposite to a conductivity type of the first semiconductor epitaxial layer; performing ion implantation to the second semiconductor epitaxial layer to form a third semiconductor epitaxial layer, where the third semiconductor epitaxial layer is located on a side of the first semiconductor epitaxial layer away from the substrate, the third semiconductor epitaxial layer is connected to the first semiconductor epitaxial layer, and a conductivity type of the third semiconductor epitaxial layer is same as the conductivity type of the first semiconductor epitaxial layer.

12 Claims, 6 Drawing Sheets

(51) Int. Cl.
*H10D 62/832* (2025.01)
*H10D 62/85* (2025.01)
*H10D 64/27* (2025.01)
*H10P 14/61* (2026.01)
*H10P 30/20* (2026.01)
*H10P 50/28* (2026.01)

(52) U.S. Cl.
CPC ....... *H10D 62/8503* (2025.01); *H10D 64/513* (2025.01); *H10P 14/61* (2026.01); *H10P 30/2042* (2026.01); *H10P 30/21* (2026.01); *H10P 50/282* (2026.01)

(58) Field of Classification Search
CPC ........... H10D 62/8325; H10D 62/8503; H10D 64/513; H10D 30/0512; H10P 14/61; H10P 30/2042; H10P 30/21; H10P 50/282
See application file for complete search history.

METHOD OF MANUFACTURING SEMICONDUCTOR STRUCTURE AND SEMICONDUCTOR STRUCTURE

CROSS REFERENCE TO RELATED APPLICATIONS

This application claims priority to Chinese Patent Application No. 2023102516061 entitled "METHOD OF MANUFACTURING SEMICONDUCTOR STRUCTURE AND SEMICONDUCTOR STRUCTURE" filed on Mar. 15, 2023, the entire content of which is incorporated herein by reference.

TECHNICAL FIELD

The present disclosure relates to the technical field of semiconductors and in particular, to a manufacturing method of a semiconductor structure and a semiconductor structure manufactured by this method.

BACKGROUND

Bipolar devices have conductivity modulation effect for minority carrier, so that bipolar high-voltage devices still have very low on-resistance. However, due to existence of extra carriers, the bipolar devices have large switching loss and low switching frequencies. Therefore, the bipolar devices are generally suitable for high-voltage and low-frequency switching applications. On the contrary, unipolar devices operate without existence of extra carriers, and have low switching loss and high switching rates. However, on-resistance of a unipolar device becomes very large because there is no minority carrier to perform conductivity modulation. Therefore, unipolar devices are often suitable for low-voltage and high-frequency switching applications. For silicon devices, operating voltages of the unipolar devices are often limited to less than 1000V.

Silicon carbide has a critical electric field about 10 times a critical electric field of silicon. Comparing the silicon devices and the silicon carbide devices which have same voltage specification, a doping-concentration for a drift layer of the silicon carbide device is 100 times a doping concentration for a drift layer of the silicon device, and a thickness for the drift layer of the silicon carbide device is only 1/10 of a thickness for the drift layer of the silicon devices, and the on-resistance for the drift layer of the silicon carbide is about 3 orders of magnitude lower than the on-resistance for the drift layer of the silicon devices. Therefore, silicon carbide unipolar devices can be suitable for operating conditions above 3000V. The silicon carbide unipolar devices include Schottky diode, JFET (Junction Field Effect Transistor) and MOSFET (Metal-Oxide-Semiconductor-Field Effect Transistor), etc.

The unipolar type transistors include JFET and MOSFET. MOSFET suffers from problems of low channel mobility and poor reliability of gate oxides. In contrast, JFET does not require the gate oxides and does not suffer from the problem of the reduced channel mobility.

Due to its material reasons, silicon carbide has a large hardness (H=9+). When manufacturing JFETs, it is more difficult to perform deep trench etching on silicon carbide than on silicon. Moreover, etching SiC or GaN-based materials during the process of manufacturing devices may cause inevitable crystal damage, thereby affecting device performance.

SUMMARY

In view of this, the present disclosure provides a manufacturing method of a semiconductor structure and a semiconductor structure.

Specifically, the present disclosure is implemented through the following technical solutions.

According to the first aspect of the present disclosure, a manufacturing method of a semiconductor structure is provided, including:

- providing a substrate, and forming a mask layer on the substrate, where the mask layer is provided with an opening exposing the substrate;
- by using the mask layer as a mask, selectively growing a first semiconductor epitaxial layer at the opening, where the first semiconductor epitaxial layer does not cover a surface of the mask layer away from the substrate;
- removing the mask layer, and forming a second semiconductor epitaxial layer on the substrate and the first semiconductor epitaxial layer by performing secondary epitaxy, wherein the second semiconductor epitaxial layer covers a surface of the first semiconductor epitaxial layer away from the substrate; wherein a conductivity type of the second semiconductor epitaxial layer is opposite to a conductivity type of the first semiconductor epitaxial layer;
- performing ion implantation to the second semiconductor epitaxial layer to form a third semiconductor epitaxial layer, where the third semiconductor epitaxial layer is located on a side of the first semiconductor epitaxial layer away from the substrate, the third semiconductor epitaxial layer is connected to the first semiconductor epitaxial layer, and a conductivity type of the third semiconductor epitaxial layer is same as the conductivity type of the first semiconductor epitaxial layer; and
- forming a gate electrode on the second semiconductor epitaxial layer, forming a source electrode on the third semiconductor epitaxial layer, and forming a drain electrode on a side of the substrate away from the second semiconductor epitaxial layer.

Optionally, before selectively growing the first semiconductor epitaxial layer at the opening, further including:

- etching the substrate at the opening to form a first trench, wherein selectively growing the first semiconductor epitaxial layer at the opening includes: selectively growing the first semiconductor epitaxial layer in the first trench.

Optionally, the orthographic projection of the opening on the substrate is a strip, a circle, an ellipse or a polygon.

Optionally, the first semiconductor epitaxial layer is an n-type semiconductor layer or a p-type semiconductor layer; a doping concentration of the first semiconductor epitaxial layer and a doping concentration of the second semiconductor epitaxial layer are both less than $10^{18}/cm^3$.

Optionally, a doping concentration of the third semiconductor epitaxial layer is greater than $10^{18}/cm^3$.

Optionally, a conductivity type of the substrate is same as the conductivity type of the first semiconductor epitaxial layer, and a doping concentration of the substrate is greater than $10^{18}/cm^3$.

Optionally, along a direction of the substrate pointing to the mask layer, a width of the opening gradually decreases.

Optionally, forming the mask layer on the substrate includes:

forming a mask material layer on the substrate, where in a direction from the substrate to the mask material layer, content for aluminium element of the mask material layer gradually increases;

etching the mask material layer to form the opening, and determining the remaining mask material layer as the mask layer;

or forming the mask layer on the substrate includes:

forming the mask material layer on the substrate, etching the mask material layer using dry etching, and controlling an etching direction to form the opening, and determining the remaining mask material layer as the mask layer, where an angle between the etching direction and the direction from the substrate to the mask material layer is an acute angle;

or forming the mask layer on the substrate includes:

forming a place-occupying material layer on the substrate; and patterning the place-occupying material layer by using an etching process to form a place-occupying layer, wherein in a direction from the substrate to the place-occupying layer, a cross-sectional area of the place-occupying layer gradually decreases;

forming a mask material layer on the place-occupying layer and the substrate; and polishing the mask material layer until the place-occupying layer is exposed and determining the remaining mask material layer as the mask layer; and removing the place-occupying layer to form the opening in the mask layer.

Optionally, a side wall of the opening is composed of a plane or a curved surface.

Optionally, the side wall of the opening is a zigzag shape, and forming the mask layer on the substrate includes:

forming place-occupying material layers on the substrate;

patterning the place-occupying material layers by using an etching process to form place-occupying layers, wherein in a direction of the substrate to the place-occupying layers, cross-sectional areas of at least two of the place-occupying layers are different;

forming a mask material layer on the place-occupying layers and the substrate;

polishing the mask material layer until a top place-occupying layer among the place-occupying layers is exposed, so that the mask material layer is converted into the mask layer; and removing the place-occupying layers to form the opening in the mask layer.

Optionally, by using the mask layer as a mask, selectively growing the first semiconductor epitaxial layer at the opening includes:

epitaxially growing the first semiconductor epitaxial layer from a bottom wall of the opening until the opening is filled up.

Optionally, materials of the first semiconductor epitaxial layer, the second semiconductor epitaxial layer, and the third semiconductor epitaxial layer are SiC or GaN-based materials.

According to another aspect of the present disclosure, a manufacturing method of a semiconductor structure is provided, including:

a substrate;

a first semiconductor epitaxial layer on the substrate, where the first semiconductor epitaxial layer exposes a part of a region of the substrate;

a second semiconductor epitaxial layer on the exposed region of the substrate, where a conductivity type of the second semiconductor epitaxial layer is opposite to a conductivity type of the first semiconductor epitaxial layer;

a third semiconductor epitaxial layer on the first semiconductor epitaxial layer (11), wherein the third semiconductor epitaxial layer is connected to the first semiconductor epitaxial layer, a conductivity type of the third semiconductor epitaxial layer is same as the conductivity type of the first semiconductor epitaxial layer;

a gate electrode on the third semiconductor epitaxial layer;

a source electrode on the third semiconductor epitaxial layer; and a drain electrode on a side of the substrate away from the second semiconductor epitaxial layer.

Optionally, a side of the substrate close to the first semiconductor epitaxial layer comprises a first trench, and a bottom of the first semiconductor epitaxial layer is in the first trench.

Optionally, the first semiconductor epitaxial layer is an n-type semiconductor layer or a p-type semiconductor layer; a doping concentration of the first semiconductor epitaxial layer and a doping concentration of the second semiconductor epitaxial layer are both less than $10^{18}/cm^3$.

Optionally, a doping concentration of the third semiconductor epitaxial layer is greater than $10^{18}/cm^3$.

Optionally, a conductivity type of the substrate is same as the conductivity type of the first semiconductor epitaxial layer, and a doping concentration of the substrate is greater than $10^{18}/cm^3$.

Optionally, a cross-sectional area of the first semiconductor epitaxial layer gradually decreases in a direction away from the substrate.

Optionally, the second semiconductor epitaxial layer includes a second trench, and the gate electrode is in the second trench.

Compared with the prior art, the present disclosure has the following beneficial effects.

According to the semiconductor structure and the manufacturing method of the semiconductor structure provided by the embodiments of the present discourse, the mask layer with the opening exposing the substrate is arranged, the first semiconductor epitaxial layer is selectively grown at the opening, and the mask layer is removed to obtain the patterned first semiconductor epitaxial layer, thereby avoiding the difficulty of SiC deep trench etching and simplifying the manufacturing method. In addition, an etching damage problem of the first semiconductor epitaxial layer is avoided, and crystal quality of the first semiconductor epitaxial layer and the second semiconductor epitaxial layer subsequently epitaxially grown on the substrate and the first semiconductor epitaxial layer is improved, thereby effectively improving device performance of the semiconductor structure.

In addition, the third semiconductor epitaxial layer connected to the first semiconductor epitaxial layer is formed by performing ion implantation to the second semiconductor epitaxial layer, and the third semiconductor epitaxial layer has the same conductivity type as the first semiconductor epitaxial layer to form a channel connecting the third semiconductor epitaxial layer and the first semiconductor epitaxial layer, thereby reducing the on-resistance, so that the semiconductor structure has a lower voltage drop under a high current density condition during operation. Therefore, the energy conversion efficiency of the system using this device is improved. The conductivity type of the second semiconductor epitaxial layer is opposite to the conductivity type of the first semiconductor epitaxial layer to form a PN junction, which effectively increases a width of a depletion layer and increases a breakdown voltage.

REFERENCE SIGNS

Figure 1:
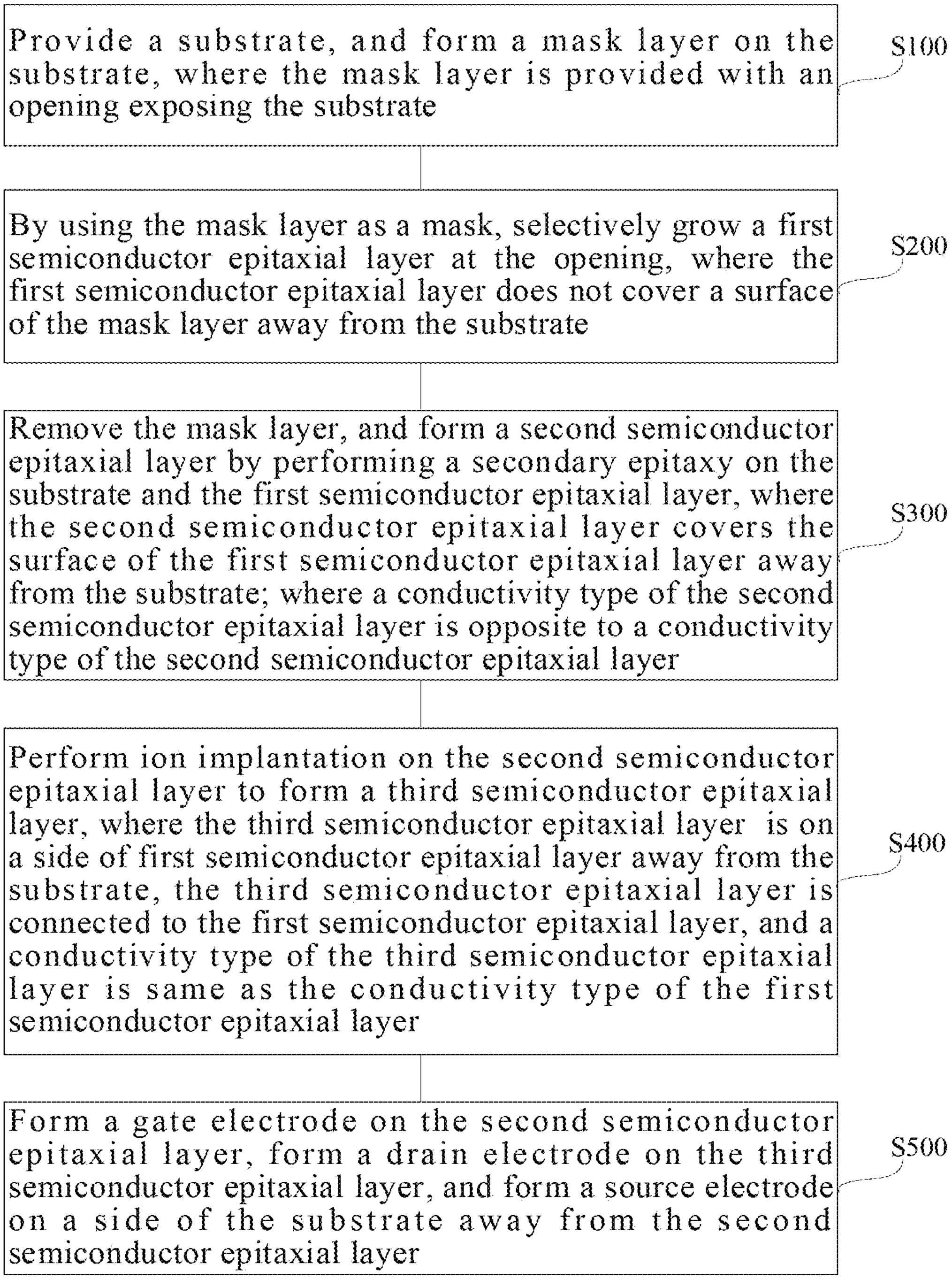
FIG. 1 is a flow chart illustrating a manufacturing method of a semiconductor structure according to some embodiments of the present disclosure.
Figure 2A:
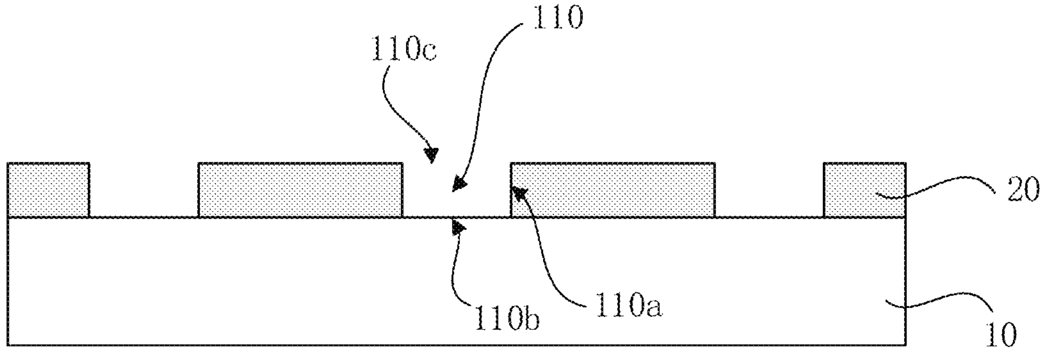
FIGS. 2(*a*) to 2(*f*) are schematic diagrams illustrating intermediate structures corresponding to the process of FIG. 1.
Figure 2B:
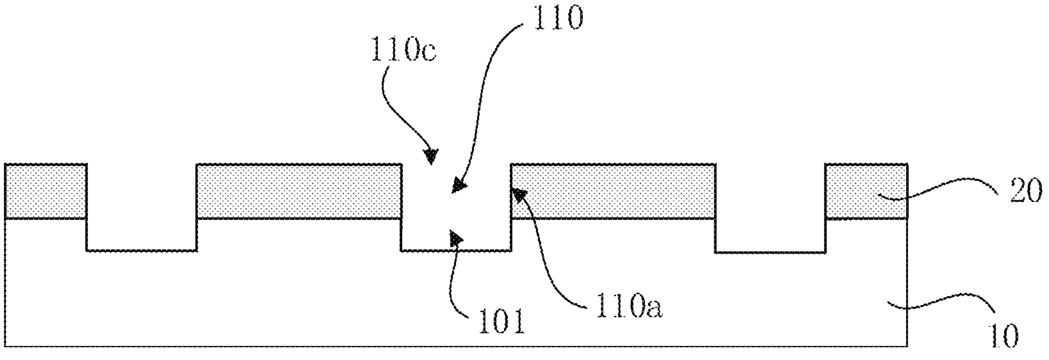
Figure 2C:
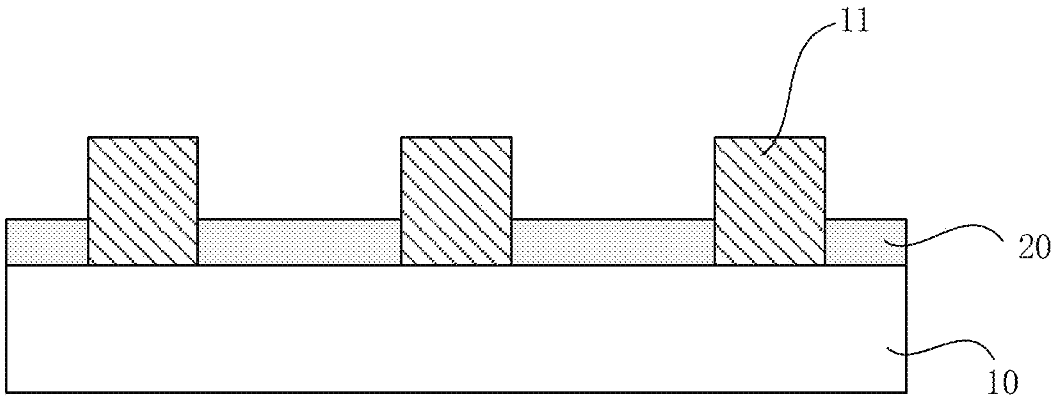
Figure 2D:
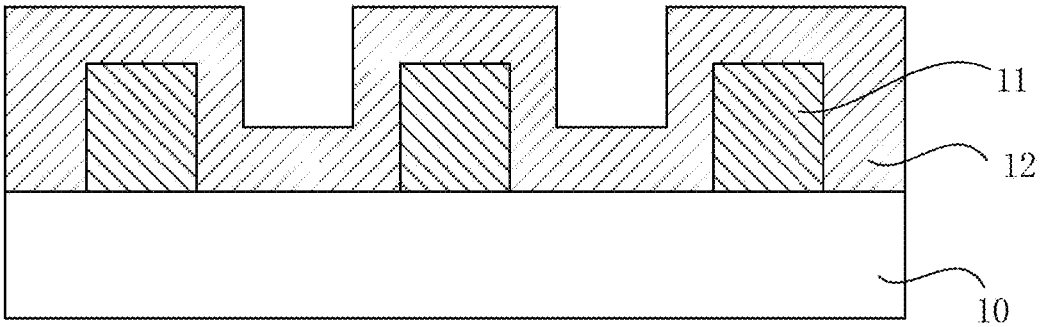
Figure 2E:
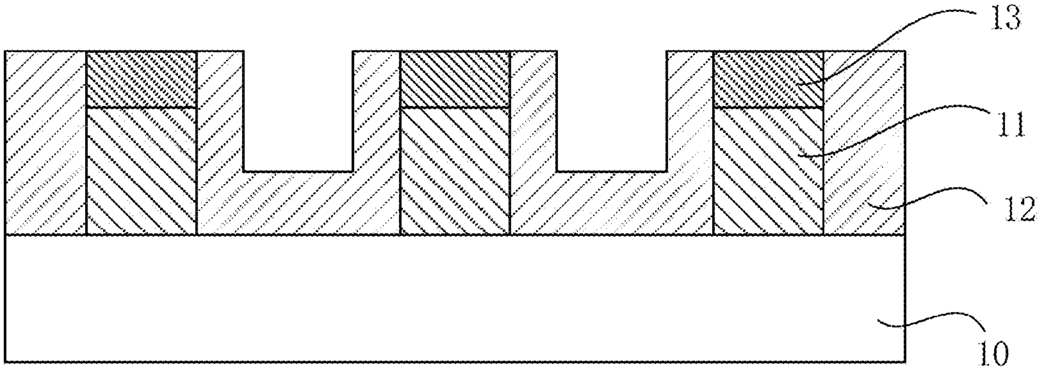
Figure 2F:
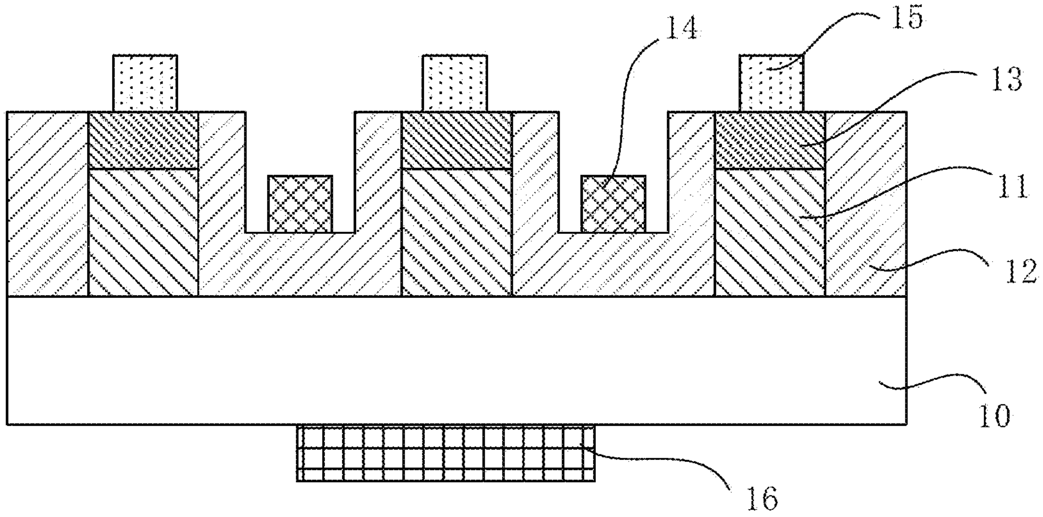

Substrate 10
First semiconductor epitaxial layer 11
Opening 110
Side wall 110*a* of the opening
Bottom wall 110*b* of opening
Opening end 110*c* of the opening
First trench 101
Second semiconductor epitaxial layer 12
Third semiconductor epitaxial layer 13
Gate electrode 14
Source electrode 15
Drain electrode 16
Mask layer 20

DETAILED DESCRIPTION

Exemplary embodiments will be described in detail herein, examples of which are illustrated in the accompanying drawings. Terms used in the present disclosure is only for the purpose of describing particular embodiments and is not intended to limit the present disclosure. As used in the present disclosure and the appended claims, the singular forms "a", "said" and "the" are intended to include the plural forms as well, unless the context clearly dictates otherwise. It should also be understood that the term "and/or" as used herein refers to and includes any or all possible combinations of one or more associated listed items.

According to an embodiment of the present disclosure, a manufacturing method of a semiconductor structure is provided. FIG. 1 is a flowchart of a manufacturing method of a semiconductor structure according to a first embodiment of the present disclosure. FIGS. 2(*a*) to 2(*f*) are schematic diagrams illustrating intermediate structures corresponding to the process of FIG. 1.

In an embodiment, referring to step S100 in FIG. 1 and as shown in FIG. 2(*a*), a substrate 10 is provided, a mask layer 20 is formed on the substrate 10, the mask layer 20 has one or more openings 110 exposing the substrate 10, and each opening 110 includes a side wall 110*a*, a bottom wall 110*b*, and an opening end 110*c*. In this embodiment, a material of the substrate 10 is SiC. In other embodiments, a material of the substrate 10 may also be a substrate material, such as Si or sapphire, etc.

The opening 110 may be formed by etching. Specifically, a mask material layer is formed on the substrate 10, and the mask material layer is etched to form the opening 110, where the remaining mask material layer after etching is the mask layer 20.

The mask material layer may be an insulating material, such as aluminium nitride (AlN), silicon dioxide ($SiO_2$), silicon nitride ($SiN_x$), etc., and is formed by using a physical vapor deposition method or a chemical vapor deposition method.

Figure 4A:
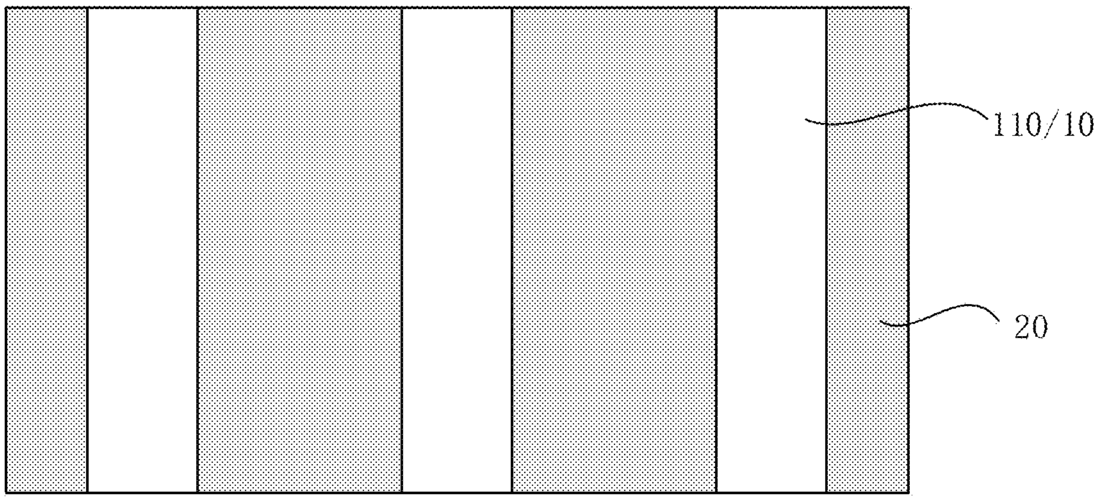
FIGS. 4(*a*) to 4(*c*) are top views of the intermediate structure obtained after step 100 according to some embodiments of the present disclosure.
Figure 4B:
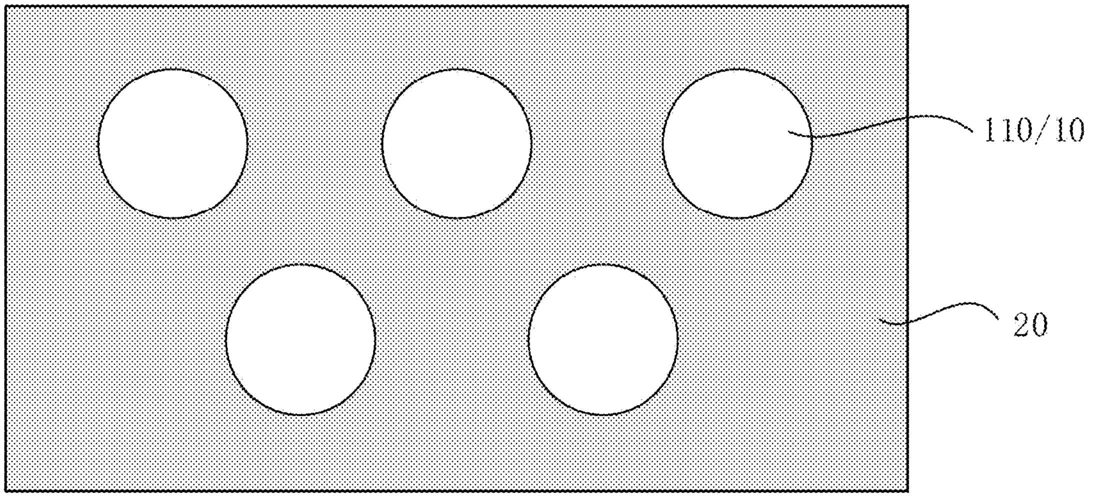
Figure 4C:
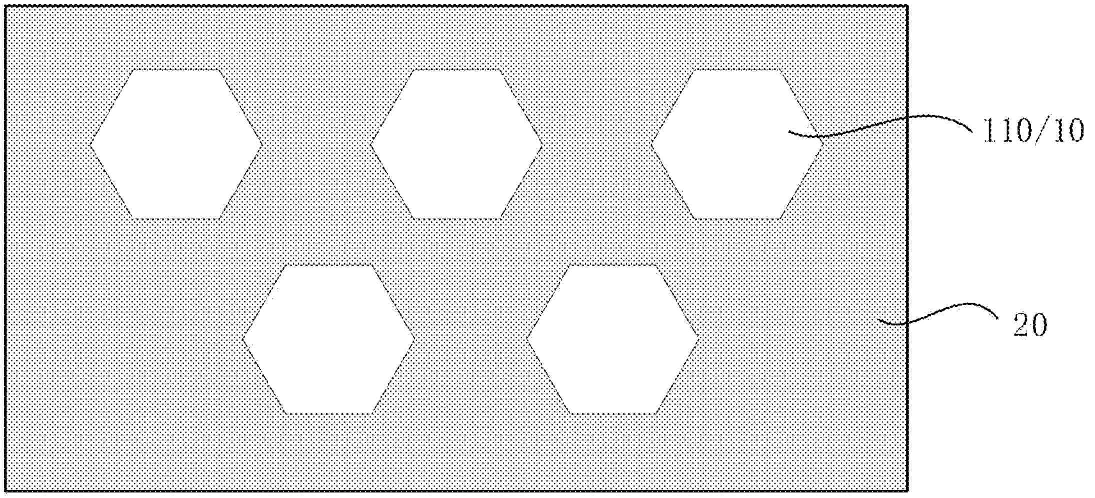

The present discourse does not limit the shape of the opening 110. FIGS. 4(*a*) to 4(*c*) are top views of the intermediate structure obtained after step 100 according to some embodiments of the present disclosure. Optionally, orthographic projections of the one or more openings 110 on the substrate 10 is one or more of a strip, a circle, an ellipse or a polygon. As shown in FIG. 4(*a*), the orthographic projection of the opening 110 in a direction perpendicular to the substrate 10 is a strip. As shown in FIG. 4(*b*) and FIG. 4(*c*), the orthographic projection of the opening 110 in the direction perpendicular to the substrate 10 may be a circular and a hexagonal, respectively.

Further, referring to step S200 in FIG. 1 and as shown in FIG. 2(*c*), by using the mask layer 20 as a mask, a first semiconductor epitaxial layer 11 is selectively grown at the opening 110, where the first semiconductor epitaxial layer 11 does not cover a surface of the mask layer 20 away from the substrate 10. In this embodiment, a material of the first semiconductor epitaxial layer 11 is SiC. In other optional embodiments, the material of the first semiconductor epitaxial layer 11 may also be a GaN-based material such as GaN or AlGaN. In other embodiments, referring to FIG. 2(*b*), before growing the first semiconductor epitaxial layer 11, the substrate 10 may be etched from the opening 110 to form a first trench 101, and the first semiconductor epitaxial layer 11 may be selectively grown from the first trench 101.

In some embodiments, the first semiconductor epitaxial layer 11 starts growing from the bottom wall 110*b* of the opening 110 until the opening 110 is filled up and the first semiconductor epitaxial layer 11 is higher than the opening end 110*c* of the opening 110, and a final thickness of the first semiconductor epitaxial layer 11 is greater than a thickness of the mask layer 20. Corresponding to different shapes of the openings, the shape of the first semiconductor epitaxial layer 11 formed in each opening 110 may also be different. For example, the first semiconductor epitaxial layer 11 formed in each opening 110 may be a cuboid, a hexagonal prism, a cylinder, or a combination of one or more thereof. This discourse does not limit to this.

In some embodiments, a material of the mask material layer (which may also be referred to as a first mask material layer) may be amorphous AlN. For the case where a thickness of the first semiconductor epitaxial layer 11 in the direction perpendicular to the substrate 10 is greater than a thickness of the mask material layer, a second mask material layer (not shown) may be formed on a side of the first mask material layer away from the substrate 10, and the material of the second mask material layer may be $SiN_x$. In other embodiments, a combination of the materials of the second mask material layer and the first mask material layer may also be: $SiN_x/SiO_2$ or $SiO_2/SiN_x$. The formation process of amorphous AlN may include: metal organic compound chemical vapor deposition, chemical vapor deposition, physical vapor deposition, or atomic layer deposition. The formation process of $SiN_x$ or $SiO_2$ may include chemical vapor deposition or physical vapor deposition.

In some embodiments, the second mask material layer may also be $SiN_x$ formed by low pressure chemical vapor deposition (LPCVD), and the first mask material layer may be $SiN_x$ formed by plasma enhanced chemical vapor deposition (PECVD).

In some embodiments, the opening 110 may penetrate the first mask material layer and the second mask material layer. After obtaining the first semiconductor epitaxial layer 11, the second mask material layer is removed by using the dry etching method. The first mask material layer is used as the etching stop layer of dry etching; and the remaining first mask material layer is removed by wet etching.

When the material of the second mask material layer is $SiN_x$ and the material of the first mask material layer is amorphous AlN, after obtaining the first semiconductor epitaxial layer 11, $SiN_x$ may be removed by performing dry etching with gas containing F (such as $CF_4$, or $C_3F_8$, etc.). The gas containing F has a high etching selectivity ratio for $SiN_x$ and amorphous AlN, that is, a faster etching rate for $SiN_x$ and a slower etching rate for amorphous AlN may be achieved, so that an end point of dry etching can be effectively detected, and stop dry etching in time. The remaining first mask material layer may be removed using alkaline solution such as KOH, NaOH, etc., and the alkaline solution such as KOH, NaOH, etc. is non-corrosive on the surfaces of the substrate 10 and the first semiconductor epitaxial layer 11. Thus, while removing amorphous AlN, the substrate 10 and the first semiconductor epitaxial layer 11 may not be damaged.

When the material of the second mask material layer is $SiN_x$ and the material of the first mask material layer is $SiO_2$, after obtaining the first semiconductor epitaxial layer 11, $SiN_x$ can be removed by performing dry etching with a mixed gas of the CF-based gas and oxygen. By adjusting a mixing ratio of the CF-based gas and oxygen, for example, by increasing the content of oxygen, the etching rate of $SiN_x$ can be significantly increased. Therefore, $SiO_2$ can effectively detect the end point of dry etching, and dry etching is stopped in time. The remaining first mask material layer may be removed using HF acid solution, and HF acid is non-corrosive to the substrate 10 and the first semiconductor epitaxial layer 11, so that the substrate 10 and the first semiconductor epitaxial layer 11 are not damaged while removing $SiO_2$.

When the material of the second mask material layer is $SiO_2$ and the material of the first mask material layer is $SiN_x$, after obtaining the first semiconductor epitaxial layer 11, $SiO_2$ can be removed by performing dry etching with a mixed gas of CF-based gas and oxygen. By adjusting the mixing ratio of CF-based gas and oxygen, such as reducing the content of oxygen, the etching rate of $SiO_2$ can be significantly increased. Therefore, $SiN_x$ can effectively detect the end point of dry etching and dry etching can be stopped in time. The remaining first mask material layer can be removed using hot phosphoric acid solution, and the hot phosphoric acid solution is non-corrosive to the substrate 10 and the first semiconductor epitaxial layer 11, so that the substrate 10 and the first semiconductor epitaxial layer 11 are not damaged while removing $SiN_x$.

Due to the material, silicon carbide has a large hardness (H=9+). During the manufacturing process, it is more difficult to etch a deep trench in silicon carbide than in silicon. The manufacture of the patterned first semiconductor epitaxial layer 11 is realized by providing the opening 110 in the mask layer 20, without etching a deep trench on the first semiconductor epitaxial layer 11, thereby solving the problem that the deep trench etching on silicon carbide is difficult.

The first semiconductor epitaxial layer 11 may be doped with n-type ions, so that the first semiconductor epitaxial layer 11 is an n-type semiconductor layer. The n-type ions may be at least one of N, P, As or Sb. The doping concentration of impurity ions in the first semiconductor epitaxial layer 11 is less than $10^{18}/cm^3$. Certainly, the first semiconductor epitaxial layer 11 may be a p-type semiconductor layer. The conductivity type of the substrate 10 is the same as the conductivity type of the first semiconductor epitaxial layer 11, and the doping concentration for the impurity ions of the substrate 10 is greater than $10^{18}/cm^3$ to reduce ohmic contact resistance between the substrate 10 and subsequent electrodes. Doping n-type ions or p-type ions may use ion implantation or in-situ doping.

Further, referring to step S300 in FIG. 1 and as shown in FIG. 2(*d*), the mask layer 20 is removed to obtain the patterned first semiconductor epitaxial layer 11. The second semiconductor epitaxial layer is formed on the substrate 10 and the first semiconductor epitaxial layer 11 by performing secondary epitaxy, where the second semiconductor epitaxial layer 12 covers the surface of the first semiconductor epitaxial layer 11 away from the substrate 10. A conductivity type of the second semiconductor epitaxial layer 12 is opposite to a conductivity type of the first semiconductor epitaxial layer 11. In this embodiment, a material of the second semiconductor epitaxial layer 12 is SiC. In other optional embodiments, the material of the second semiconductor epitaxial layer 12 may also be a GaN-based material such as GaN or AlGaN.

Before the secondary epitaxy, the first semiconductor epitaxial layer 11 has been grown on the region corresponding to the opening 110 of the substrate 10. In an epitaxial direction, a height difference is between the upper surface of the first semiconductor epitaxial layer 11 and the surface of the substrate 10. During secondary epitaxy, a height difference is formed between the second semiconductor epitaxial layer 12 grown directly on the surface of the substrate 10 and the second semiconductor epitaxial layer 12 grown on the upper surface of the first semiconductor epitaxial layer 11, that is, the second semiconductor epitaxial layer 12 conformally covers the surfaces of the substrate 10 and the first semiconductor epitaxial layer 11. The surface of the second semiconductor epitaxial layer 12 away from the substrate 10 is provided with a second trench. Therefore, the patterned first semiconductor epitaxial layer 11 can be obtained without etching the first semiconductor epitaxial layer 11, which simplifies the difficulty of manufacturing the second semiconductor epitaxial layer 12 and solves the problem that etching the deep trench in silicon carbide is difficulty.

The conductivity type of the second semiconductor epitaxial layer 12 is different from the conductivity type of the first semiconductor epitaxial layer 11. Taking the first semiconductor epitaxial layer 11 as an n-type semiconductor layer as an example, the second semiconductor epitaxial layer 12 is a p-type semiconductor layer. Taking the first semiconductor epitaxial layer 11 as a p-type semiconductor layer as an example, the second semiconductor layer 12 is an n-type semiconductor layer. The doping concentration of the impurity ions in the second semiconductor epitaxial layer 12 is less than $10^{18}/cm^3$.

Forming process for the first semiconductor epitaxial layer 11 and the second semiconductor epitaxial layer 12 may include: Atomic Layer Deposition (ALD), or Chemical Vapor Deposition (CVD), or molecular beam epitaxial (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

Further, referring to step S400 in FIG. 1 and as shown in FIG. 2(*c*), ion implantation is performed on the second semiconductor epitaxial layer 12 to form a third semiconductor epitaxial layer 13, the third semiconductor epitaxial layer 13 is located on a side of the first semiconductor epitaxial layer 11 away from the substrate 10, the third semiconductor epitaxial layer 13 is connected to the first semiconductor epitaxial layer 11, and a conductivity type of the third semiconductor epitaxial layer 13 is same as the conductivity type of the first semiconductor epitaxial layer 11. A material of the third semiconductor epitaxial layer 13 is the same as a material of the second semiconductor epitaxial layer 12.

As shown in FIG. 2(*c*), ion implantation is performed to the part of the second semiconductor epitaxial layer 12 covering the upper surface of the first semiconductor epitaxial layer 11 to form the third semiconductor epitaxial layer 13. The conductivity type of the third semiconductor epitaxial layer 13 is the same as the conductivity type of the first semiconductor epitaxial layer 11 and is different from the conductivity type of the second semiconductor epitaxial layer 12. Therefore, the third semiconductor epitaxial layer 13 is connected to the first semiconductor epitaxial layer 11, and a PN junction is formed between the third semiconductor epitaxial layer 13 and the second semiconductor epitaxial layer 12.

Specifically, taking the first semiconductor epitaxial layer 11 being an n-type semiconductor layer as an example, the second semiconductor epitaxial layer 12 is a p-type semiconductor layer and the third semiconductor epitaxial layer 13 is the n-type semiconductor layer. Taking the first semiconductor epitaxial layer 11 being the p-type semiconductor layer as an example, the second semiconductor layer 12 is the n-type semiconductor layer, and the third semiconductor epitaxial layer 13 is the p-type semiconductor layer. The doping concentration of the impurity ions of the third semiconductor epitaxial layer 13 is greater than $10^{18}/cm^3$ to reduce the ohmic contact resistance between the third semiconductor epitaxial layer 13 and the subsequent electrodes.

Further, referring to step S500 in FIG. 1 and as shown in FIG. 2(*f*), a gate electrode 14 is formed on the second semiconductor epitaxial layer 12, a source electrode 15 is formed on the third semiconductor epitaxial layer 13, and a drain electrode 16 is formed on a side of the substrate 10 away from the second semiconductor epitaxial layer 12.

Specifically, a gate electrode 14 is formed at the second trench of the second semiconductor epitaxial layer 12, a source electrode 15 is formed on the third semiconductor epitaxial layer 13, and a drain electrode 16 is formed on a side of the substrate 10 away from the second semiconductor epitaxial layer 12. The manufacturing method for the semiconductor of the present disclosure is used to manufacture silicon carbide junction field effect transistors.

According to the semiconductor structure and the manufacturing method of the semiconductor structure provided by the embodiments of the present discourse, the mask layer with the opening exposing the substrate is arranged, the first semiconductor epitaxial layer is selectively grown at the opening, and the mask layer is removed to obtain the patterned first semiconductor epitaxial layer, thereby avoiding the difficulty of SiC deep trench etching and simplifying the manufacturing method. In addition, an etching damage problem of the first semiconductor epitaxial layer is avoided, and crystal quality of the first semiconductor epitaxial layer and the second semiconductor epitaxial layer subsequently epitaxially grown on the substrate and the first semiconductor epitaxial layer is improved, thereby effectively improving device performance of the semiconductor structure.

The third semiconductor epitaxial layer connected to the first semiconductor epitaxial layer is formed by performing ion implantation to the second semiconductor epitaxial layer, and the third semiconductor epitaxial layer has the same conductivity type as the first semiconductor epitaxial layer to form a channel connecting the third semiconductor epitaxial layer and the first semiconductor epitaxial layer, thereby reducing the on-resistance, so that the semiconductor structure has a lower voltage drop under a high current density condition during operation. Therefore, the energy conversion efficiency of the system using this device is improved, the conductivity type of the second semiconductor epitaxial layer is opposite to the conductivity type of the first semiconductor epitaxial layer to form a PN junction, which effectively increases the width of the depletion layer and increases the breakdown voltage.

Figure 5:
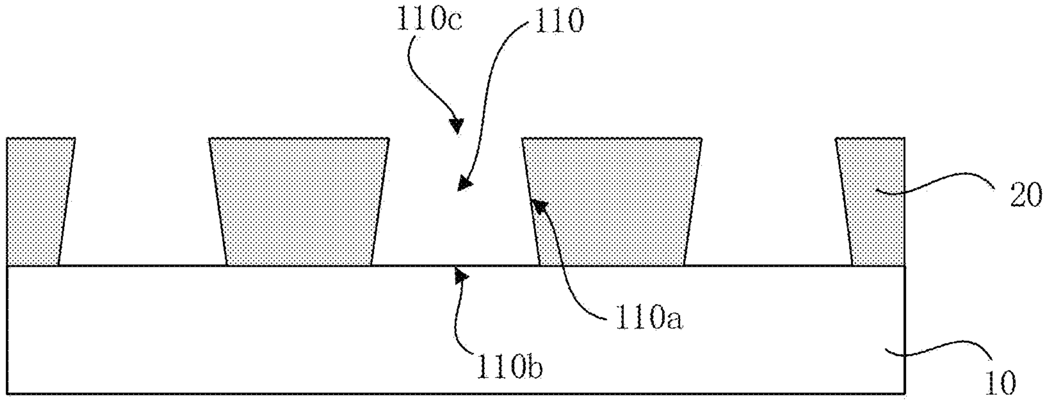
FIG. 5 is a schematic diagram of an intermediate structure corresponding to part of the process of the manufacturing method of a semiconductor structure according to some embodiments of the present disclosure.

FIG. 5 is a schematic diagram of an intermediate structure corresponding to part of the process of the manufacturing method of a semiconductor structure according to some embodiments of the present disclosure. In some embodiments, as shown in FIG. 5, along a direction of the substrate 10 pointing to the mask layer 20, a width of the opening 110 gradually decreases.

In an embodiment, the mask layer 20 including the opening 110 with a gradually decreased opening width may be formed by the following steps: forming a mask material layer on the substrate 10, where in the direction of the substrate 10 to the mask material layer, the content of the aluminium element of the mask material layer gradually increases; etching the mask material layer to form the opening 110, where the remaining mask material layer is determined as the mask layer 20.

The material of the mask material layer may be silicon oxide. The content of aluminium element gradually increases from bottom to top. The etching rate is negatively correlated with the content of aluminium element. Therefore, the etching rate is faster in the region of the mask material layer close to the substrate 10 and thus an area of the bottom wall 110*b* of the opening 110 is larger than an area of the opening end 110*c* of the opening 110. Optionally, the gradual increase of the content of aluminium element may be a linear increase, a stepwise increase, etc., which is not limited in this discourse.

In an embodiment, the mask material layer 20 including the opening 110 with a gradually decreased opening width may be formed by following steps: forming a mask material layer on the substrate 10, etching the mask material layer using dry etching, and forming the opening 110 by controlling an etching direction. The remaining mask material layer after etching is the mask layer 20, and the angle between the etching direction and the direction from the substrate 10 to the mask material layer is an acute angle.

In an embodiment, the opening 110 with a gradually decreased opening width may be implemented by a place-occupying layer. Specific steps include: forming a place-occupying material layer on the substrate; using an etching process to pattern the place-occupying material layer to form a place-occupying layer, where the cross-sectional area of the place-occupying layer gradually decreases in the direction from the substrate to the place-occupying layer; forming a mask material layer on the place-occupying layer and the substrate; polishing the mask material layer until the place-occupying layer is exposed and the remaining mask material layer is the mask layer 20; and removing the place-occupying layer to form the opening 110 within the mask layer 20.

The gradually decreased opening width of the opening 110 means that the opening 110 has an inward side wall in the direction from the bottom wall 110*b* toward opening end 110*c*. The inward side wall of the opening 110 may terminate at least part of the dislocations in the first semiconductor epitaxial layer 11, so that the dislocations cannot continue to extend in the second semiconductor epitaxial layer 12. Therefore, the substrate 10 having the above mask layer 20 thereon can reduce the dislocation density of the first semiconductor epitaxial layer 11 and the second semiconductor epitaxial layer 12, thereby improving the crystal quality of the first semiconductor epitaxial layer 11 and the second semiconductor epitaxial layer 12, and improving the performance of the semiconductor structures. It should be noted that the inward side walls refers that the distance between the side walls of the opening 110 gradually decreases in the direction perpendicular to the plane of the substrate 10 and pointing from the substrate 10 to the first semiconductor epitaxial layer 11. In addition, the dimension of the bottom wall 110*b* is large, and the SiC-based material has a large nucleation area and is easy to grow.

Optionally, the thickness of the mask layer 20 may range from 1 um to 100 μm. The first semiconductor epitaxial layer 11 is epitaxially grown from the bottom wall of the opening 110 until the opening 110 is filled up.

Figure 6A:
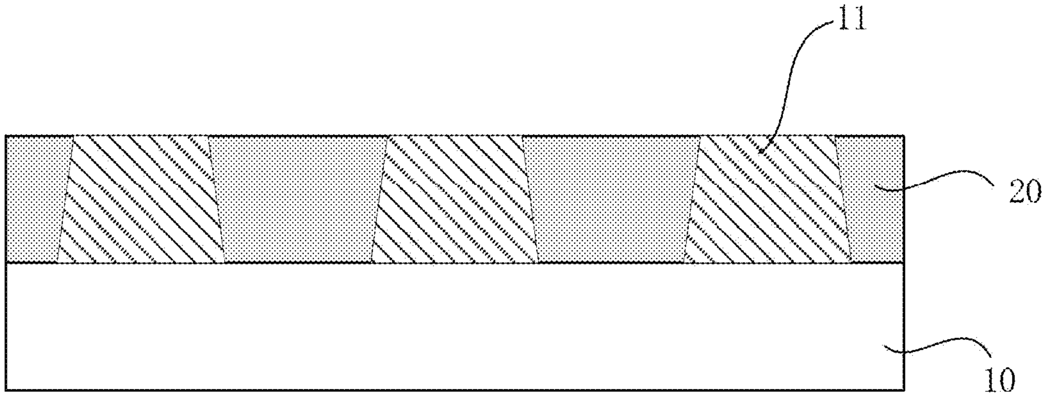
FIGS. 6(*a*) to 6(*c*) are schematic diagrams illustrating intermediate structures corresponding to part of the process of the semiconductor manufacturing method according to some embodiments of the present disclosure.
Figure 6B:
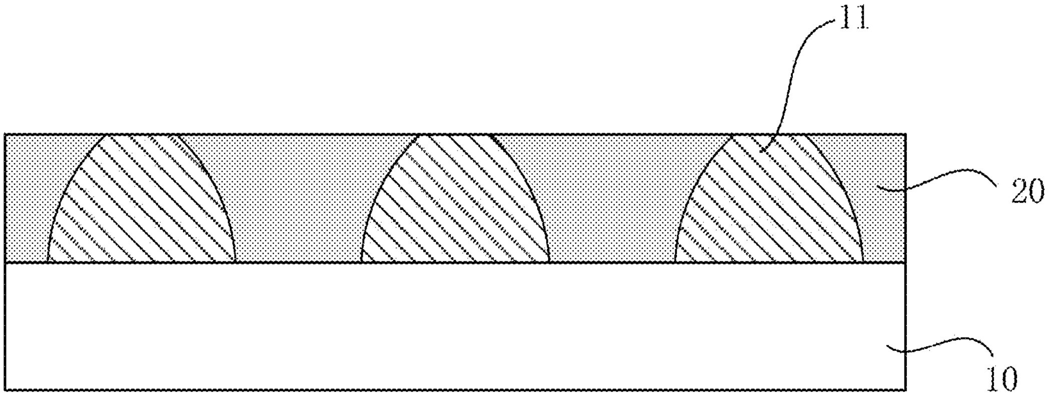
Figure 6C:
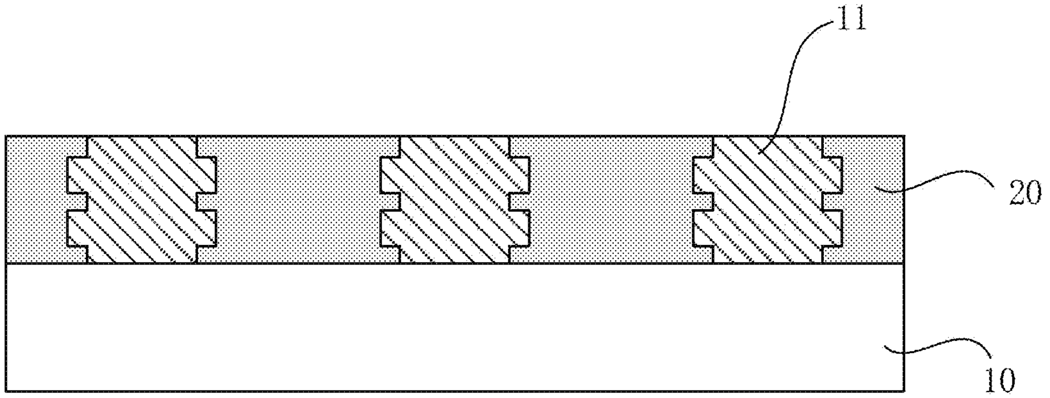

FIGS. 6(*a*) to 6(*c*) are schematic diagrams illustrating intermediate structures corresponding to part of the process of the manufacturing method of a semiconductor structure according to some embodiments of the present disclosure.

Referring to FIGS. 6(*a*) and 6(*b*), according to the manufacturing method of this embodiment, the side wall 110*a* of the opening 110 is composed of a straight surface or a curved surface. In an embodiment, the curved surface is an upward convex curved surface. In other embodiments, the curved surface may also be a downward concave curved surface, or a wavy curved surface, etc. Optionally, multiple side walls 110*a* are not curved surfaces or straight surfaces at the same time. Optionally, the opening 110 may be a pyramid or a truncated cone. Alternatively, the opening 110 may be any combination of a spherical cone, a prism and a circular conc. The thickness of the opening ranges from 1 um to 100 um, the first semiconductor epitaxial layer 11 is epitaxially grown from a bottom wall of the opening 110 until the opening 110 is filled up.

In some embodiments, as shown in FIG. 6(*c*), the side wall 110*a* of the opening 110 is in a zigzag shape. In an embodiment, the zigzag opening 110 may be obtained through the following steps.

Multiple place-occupying material layers are formed on the substrate 10; the place-occupying material layers are patterned respectively using an etching process to form multiple place-occupying layers, where in the direction from the substrate to the place-occupying layers, at least two of the place-occupying layers have different cross-sectional areas, that is, the place-occupying layers are combined together in a zigzag shape; a mask material layer is formed on the place-occupying layers and the substrate 10; the mask material layer is polished until the top place-occupying layer of the place-occupying layers is exposed, so that the mask material layer is converted into the mask layer 20; the place-occupying layers are removed to form the opening 110 within the mask layer 20.

Multiple place-occupying layers can be removed by wet etching, such as using hydrofluoric acid. It should be noted that, when removing the place-occupying layers, the materials of the place-occupying layers are different from the material of the mask layer 20, the etching rate of the place-occupying layers etching by the etching liquid used in wet etching is higher than the etching rate of the mask layer etching by the etching liquid used in wet etching, so that the place-occupying layers are removed first, and the mask layer 20 are remained.

The first semiconductor epitaxial layer 11 is manufactured through the zigzag side wall opening 110, so that the first semiconductor epitaxial layer 11 is formed into a semiconductor layer having a zigzag side wall structure to increase the contact area between the first semiconductor epitaxial layer 11 and the second semiconductor epitaxial layer and enhance the control effect of the gate electrode 14.

Figure 3:
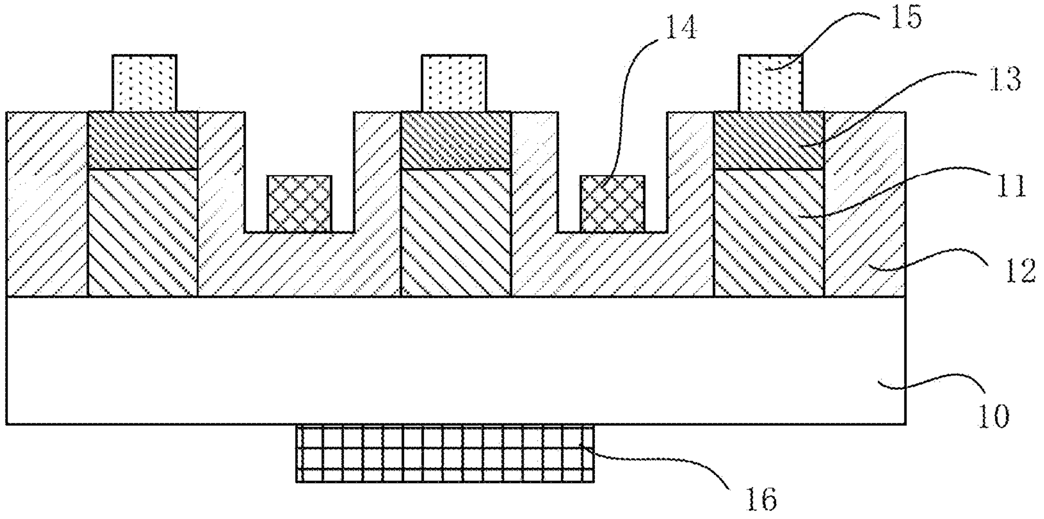
FIG. 3 is a schematic diagram of a semiconductor structure manufactured by a manufacturing method of a semiconductor structure according to some embodiments of the present disclosure.

In some embodiments, the semiconductor structure manufactured by the manufacturing method of the semiconductor structure provided in this disclosure is shown in FIG. 3. The semiconductor structure includes: a substrate 10; a first semiconductor epitaxial layer on the substrate 10, where the first semiconductor epitaxial layer 11 exposes a part of the substrate 10; the second semiconductor epitaxial layer 12 on the exposed region of the substrate 10, where the second semiconductor epitaxial layer 12 conformally covers the side wall of the first semiconductor epitaxial layer 11, where the second semiconductor epitaxial layer 12 includes a second trench, a conductivity type of the second semiconductor epitaxial layer 12 is opposite to a conductivity type of the first semiconductor epitaxial layer 11; a third semiconductor epitaxial layer 13 on the first semiconductor epitaxial layer 11, where the third semiconductor epitaxial layer 13 is connected to the first semiconductor epitaxial layer, a conductivity type of the third semiconductor epitaxial layer 13 is same as the conductivity type of the first semiconductor epitaxial layer 11; a source electrode 15 on the third semiconductor epitaxial layer 13; a gate electrode 14 on the second trench; a drain electrode 16 on a side of the substrate 10 away from the second semiconductor epitaxial layer 12.

Optionally, as shown in FIG. 2(*b*), a side of the substrate 10 close to the first semiconductor epitaxial layer 11 includes a first trench 101, and a bottom of the first semiconductor epitaxial layer 11 is in the first trench 101.

Optionally, the orthographic projection of the first semiconductor epitaxial layer 11 on the substrate 10 is one or more of a strip, a circle, an ellipse or a polygon.

In some embodiment, a cross-sectional area of the first semiconductor epitaxial layer 11 gradually decreases in a direction away from the substrate 10. The first semiconductor epitaxial layer 11 may be a prism or a frustum cone. Alternatively, the first semiconductor epitaxial layer 11 may be any combination of a spherical cone and a prism or a circular cone.

Optionally, the first semiconductor epitaxial layer 11 is an n-type semiconductor layer or a p-type semiconductor layer. In an embodiment, the conductivity type of the substrate 10 is the same as the conductivity type of the first semiconductor epitaxial layer 11.

In an embodiment, the doping concentration of the substrate 10 is greater than $10^{18}/cm^3$; the doping concentration of the first semiconductor epitaxial layer 11 and the doping concentration of the second semiconductor epitaxial layer 12 are both less than $10^{18}/cm^3$; the doping concentration of the third semiconductor epitaxial layer 13 is greater than $10^{18}/cm^3$.

The foregoing are only some embodiments of the present disclosure and are not intended to limit the present disclosure, and any modifications, equivalent substitutions, improvements, etc., made within the spirit and principles of the present disclosure shall be included within the scope of protection of the present disclosure.

What is claimed is:

1. A manufacturing method of a semiconductor structure, comprising:

providing a substrate, and forming a mask layer on the substrate, wherein the mask layer is provided with an opening exposing the substrate;

by using the mask layer as a mask, selectively growing a first semiconductor epitaxial layer at the opening, wherein the first semiconductor epitaxial layer does not cover a surface of the mask layer away from the substrate;

removing the mask layer, and forming a second semiconductor epitaxial layer on the substrate and the first semiconductor epitaxial layer by performing secondary epitaxy, wherein the second semiconductor epitaxial layer covers a surface of the first semiconductor epitaxial layer away from the substrate; wherein a conductivity type of the second semiconductor epitaxial layer is opposite to a conductivity type of the first semiconductor epitaxial layer;

performing ion implantation to the second semiconductor epitaxial layer to form a third semiconductor epitaxial layer, wherein the third semiconductor epitaxial layer is on a side of the first semiconductor epitaxial layer away from the substrate, the third semiconductor epitaxial layer is connected to the first semiconductor epitaxial layer, and a conductivity type of the third semiconductor epitaxial layer is same as the conductivity type of the first semiconductor epitaxial layer; and forming a gate electrode on the second semiconductor epitaxial layer, forming a source electrode on the third semiconductor epitaxial layer, and forming a drain electrode on a side of the substrate away from the second semiconductor epitaxial layer.

2. The manufacturing method of the semiconductor structure according to claim 1, before selectively growing the first semiconductor epitaxial layer at the opening, further comprising:

etching the substrate at the opening to form a first trench; wherein selectively growing the first semiconductor epitaxial layer at the opening comprises:

selectively growing the first semiconductor epitaxial layer in the first trench.

3. The manufacturing method of the semiconductor structure according to claim 1, wherein an orthographic projection of the opening on the substrate is a bar, a circle, an ellipse or a polygon.

4. The manufacturing method of the semiconductor structure according to claim 1, wherein the first semiconductor epitaxial layer is an n-type semiconductor layer or a p-type semiconductor layer; a doping concentration of the first semiconductor epitaxial layer and a doping concentration of the second semiconductor epitaxial layer are both less than $10^{18}/cm^3$.

5. The manufacturing method of the semiconductor structure according to claim 1, wherein a doping concentration of the third semiconductor epitaxial layer is greater than $10^{18}/cm^3$.

6. The manufacturing method of the semiconductor structure according to claim 1, wherein a conductivity type of the substrate is same as the conductivity type of the first semiconductor epitaxial layer, and a doping concentration of the substrate is greater than $10^{18}/cm^3$.

7. The manufacturing method of the semiconductor structure according to claim 1, wherein along a direction of the substrate pointing to the mask layer, a width of the opening gradually decreases.

8. The manufacturing method of the semiconductor structure according to claim 7, wherein forming the mask layer on the substrate comprises:

forming a mask material layer on the substrate, wherein in a direction from the substrate to the mask material layer, content for aluminium element of the mask material layer gradually increases; and etching the mask material layer to form the opening, wherein the remaining mask material layer is converted into the mask layer;

or forming the mask layer on the substrate comprises:

forming the mask material layer on the substrate; and etching the mask material layer using dry etching, and controlling an etching direction to form the opening, wherein the remaining mask material layer is converted into the mask layer, and an angle between the etching direction and the direction from the substrate to the mask material layer is an acute angle;

or forming the mask layer on the substrate comprises:

forming a place-occupying material layer on the substrate; and patterning the place-occupying material layer by using an etching process to form a place-occupying layer, wherein in a direction from the substrate to the place-occupying layer, a cross-sectional area of the place-occupying layer gradually decreases;

forming a mask material layer on the place-occupying layer and the substrate;

polishing the mask material layer until the place-occupying layer is exposed, wherein the remaining mask material layer is converted into the mask layer; and removing the place-occupying layer to form the opening in the mask layer.

9. The manufacturing method of the semiconductor structure according to claim 7, wherein by using the mask layer as a mask, selectively growing the first semiconductor epitaxial layer at the opening comprises:

epitaxially growing the first semiconductor epitaxial layer from a bottom wall of the opening until the opening is filled up.

10. The manufacturing method of a semiconductor structure according to claim 1, wherein a side wall of the opening is composed of a plane or a curved surface.

11. The manufacturing method of the semiconductor structure according to claim 1, wherein a side wall of the opening is a zigzag shape, and forming the mask layer on the substrate comprises:

forming place-occupying material layers on the substrate;

patterning the place-occupying material layers by using an etching process to form place-occupying layers, wherein in a direction of the substrate to the place-occupying layers, cross-sectional areas of at least two of the place-occupying layers are different;

forming a mask material layer on the place-occupying layers and the substrate;

polishing the mask material layer until a top place-occupying layer among the place-occupying layers is exposed, so that the mask material layer is converted into the mask layer; and removing the place-occupying layers to form the opening in the mask layer.

12. The manufacturing method of the semiconductor structure according to claim 1, wherein materials of the first semiconductor epitaxial layer, the second semiconductor epitaxial layer, and the third semiconductor epitaxial layer are SiC or GaN-based materials.

* * * * *